United States Patent
Clifton et al.

(10) Patent No.: US 10,845,436 B2
(45) Date of Patent: Nov. 24, 2020

(54) ENERGY MONITOR

(71) Applicant: Orison, Inc., Cody, WY (US)

(72) Inventors: Eric Douglass Clifton, Cody, WY (US); Marc Berte, Leesburg, VA (US)

(73) Assignee: Orison, Inc., Cody, WY (US)

( * ) Notice: Subject to any disclaimer, the term of this patent is extended or adjusted under 35 U.S.C. 154(b) by 0 days.

(21) Appl. No.: 16/035,373

(22) Filed: Jul. 13, 2018

(65) Prior Publication Data

US 2019/0079144 A1  Mar. 14, 2019

Related U.S. Application Data (60) Provisional application No. 62/532,067, filed on Jul. 13, 2017.

(51) Int. Cl.
| | |
|---|---|
| *G01R 33/02* | (2006.01) |
| *G01R 19/25* | (2006.01) |
| *G01R 19/00* | (2006.01) |
| *G01R 15/20* | (2006.01) |
| *G01R 21/133* | (2006.01) |
| *G05B 19/042* | (2006.01) |

(52) U.S. Cl.
CPC ....... *G01R 33/0206* (2013.01); *G01R 15/207* (2013.01); *G01R 19/0092* (2013.01); *G01R 19/2513* (2013.01); *G01R 15/205* (2013.01); *G01R 21/133* (2013.01); *G05B 19/0425* (2013.01)

(58) Field of Classification Search
CPC ............. G01R 33/0206; G01R 15/207; G01R 19/2513; G01R 19/0092; G01R 15/205; G01R 21/133; G05B 19/0425
See application file for complete search history.

(56) References Cited

U.S. PATENT DOCUMENTS

| | | | |
|---|---|---|---|
| 6,538,414 | B1 | 3/2003 | Turuga et al. |
| 7,206,670 | B2 | 4/2007 | Pimputkar et al. |
| 8,463,449 | B2 | 6/2013 | Sanders |
| 8,700,224 | B2 | 4/2014 | Mathiowetz |
| 9,063,525 | B2 | 6/2015 | Sanders et al. |

(Continued)

FOREIGN PATENT DOCUMENTS

| | | |
|---|---|---|
| CN | 102244677 | 6/2011 |
| CN | 102354167 | 6/2011 |

(Continued)

OTHER PUBLICATIONS

Xtrinsic MAG3110 Three-Axis, Digital Magnetometer, Freescale Semiconductor, 2013 (Year: 2013).*

(Continued)

*Primary Examiner* — Daniel R Miller
(74) *Attorney, Agent, or Firm* — James Scott Nolan (57) ABSTRACT

A system for detecting current magnitudes in a circuit breaker panel includes multiple 3-sensor magnometers placed over the main breaker and branch circuits in the circuit breaker enclosure. The sensors communicate with a local processing node, which analyzes the raw data to compensate for external and local interference, and provides an estimated current measurement. The estimated current measurement is then communicated back to a user system which can then use the information to better manage current input and output.

14 Claims, 8 Drawing Sheets

(56) References Cited

U.S. PATENT DOCUMENTS

| | | |
|---|---|---|
| 9,208,267 B2 | 12/2015 | Miller |
| 2010/0017045 A1 | 1/2010 | Nesler et al. |
| 2011/0004357 A1 | 1/2011 | Mathiowetz |
| 2011/0013427 A1 | 1/2011 | Wier et al. |
| 2011/0076542 A1 | 3/2011 | Farmer |
| 2012/0083934 A1 | 4/2012 | Jesudason et al. |
| 2012/0197449 A1 | 8/2012 | Sanders |
| 2013/0066477 A1 | 3/2013 | Jiang |
| 2013/0229173 A1 | 9/2013 | Bertrand |
| 2014/0148969 A1 | 5/2014 | Graziano et al. |
| 2014/0159487 A1 | 6/2014 | Han |
| 2015/0026343 A1 | 1/2015 | Borges et al. |
| 2015/0309521 A1 | 10/2015 | Pan |
| 2015/0378383 A1 | 12/2015 | Hsu |
| 2016/0033986 A1 | 2/2016 | Kamel et al. |
| 2016/0126783 A1 | 5/2016 | Cheng et al. |
| 2016/0187396 A1 | 6/2016 | Beiner et al. |
| 2016/0187449 A1* | 6/2016 | Beiner .............. G01R 35/005 324/74 |

FOREIGN PATENT DOCUMENTS

| | | |
|---|---|---|
| CN | 102608973 | 3/2012 |
| CN | 103679304 | 8/2012 |
| CN | 104243247 | 6/2013 |
| CN | 104483838 | 11/2014 |
| CN | 104715340 | 3/2015 |
| CN | 202586366 | 5/2015 |
| EP | 2278344 A2 | 1/2011 |
| EP | 2840545 | 4/2013 |
| WO | 2014077774 | 9/2010 |
| WO | 2011106915 | 9/2011 |
| WO | 2019014630 A1 | 1/2019 |

OTHER PUBLICATIONS

Adafruit TCA9548A 1-to-8 I2C Multiplexer Breakout, available at https://learn.adafruit.com/adafruit-tca9548a-1-to-8-i2c-multiplexer-breakout on Oct. 29, 2015 (Year: 2015).*

D. Ramirez et al, Design and experimental verification of an intelligent sensor to measure the energy consumption in a one-phase AC line, Measurement, 42, 2009 (Year: 2009).*

TCS, Cloud-based Energy Management Analytics (CBEMA) Solution, Aug. 1, 2013.

Borse Bhagyashree, Energy Management Technology Based on Cloud Network, 2014.

Prof. R. V. Dagade, Intelligent Cloud Home Energy Management System, 2015.

Billion 5, Billion BEsmart Intelligent Energy Saving Cloud, Jan. 29, 2015.

Indian Journal of Science and Technology, Smart Power Monitoring and Control System through Internet of things using Cloud Data Storage, Aug. 2015.

Business Wire, Cloud-Based Building Energy Management Solutions, Feb. 22, 2016.

International Search Report and Written Opinion dated Jan. 4, 2019 for International Application No. PCT/US2018/042149.

* cited by examiner

```
#include <Wire.h> //I2C Arduino Library
define addr 0x1E //I2C Address for The HMC5883 unsigned long timeloop;
unsigned long time;

void setup() {
  Serial.begin(115200);
  Wire.begin();
  Wire.beginTransmission(addr); //start talking
  Wire.write(0x00); // set register
  //Wire.write(0x70); // 8-average, 15 Hz default, normal measurement
  Wire.write(0x1C); //1-average, 220 Hz, normal measurement
  Wire.write(0x01); // set register
  Wire.write(0x00); // gain 0 (0.73mg/LSB)
  Wire.write(0x02); // Set the Register
  Wire.write(0x00); // Tell the HMC5883 to Continuously Measure
  Wire.endTransmission();
}
void loop()
{
  timeloop = millis();

while (timeloop <= 200) {
    int x, y, z; //triple axis data
    //Tell the HMC what regist to begin writing data into
    Wire.beginTransmission(addr);
    Wire.write(0x03); //start with register 3.
    Wire.endTransmission();
    //Read the data.. 2 bytes for each axis.. 6 total bytes
    Wire.requestFrom(addr, 6);
    if (6 <= Wire.available()) {
      x = Wire.read() << 8; //MSB  x
      x |= Wire.read(); //LSB  x
      z = Wire.read() << 8; //MSB  z
      z |= Wire.read(); //LSB z
      y = Wire.read() << 8; //MSB y
      y |= Wire.read(); //LSB y
    }
    timeloop = millis();
    time = micros();
    // Show Values on USB/serial echo
    Serial.print(time);
    Serial.print(" ");
    Serial.print(x);
    Serial.print(" ");
    Serial.print(y);
    Serial.print(" ");
    Serial.println(z);
    delayMicroseconds(2700);
  }
}
```

Fig. 8

ENERGY MONITOR

RELATED APPLICATION

This Application claims the benefit of priority to U.S. Provisional Patent Application Ser. No. 62/532,067 entitled "Energy Monitor" filed Jul. 13, 2017.

FIELD OF THE INVENTION

The present invention pertains generally to devices and methods for measuring electric current. More specifically, the present invention pertains to vector magnetometer based detection of electric currents in a nearby wire. The present invention is particularly, but not exclusively, useful as a system for detecting current magnitudes in a circuit breaker panel.

BACKGROUND OF THE INVENTION

A variety of devices for detecting and measuring current have been invented since the development of the galvanometer. Modern ammeters are placed in series with an electronic circuit in order to measure the flow of current through the circuit. Since an ammeter is placed in series with a circuit, it must present as little resistance as possible to the circuit. Nonetheless, it is impossible to present absolutely zero resistance to the circuit, so an ammeter causes a voltage drop in the circuit. Additionally, in certain circumstances it may be inconvenient to have to add a new element to a circuit in order to measure current.

Certain methods which avoid inserting new circuit elements, such as current clamps and Rogowski coils, are commonly used to measure AC currents. Since these rely on inductance to a sensing coil, they are effectively transformers, drawing an amount of current proportional to the current in the wire being measured. The jaws of a current clamp must be placed around the wire in which current is to be measured. Since an iron core is commonly used in a current clamp, the presence of a DC current can permanently magnetize the core, distorting the accuracy of the clamp's future measurements. A Rogowski coil avoids the issue of permanent magnetization of the core. Nonetheless, the Rogowski coil may require more careful positioning in order to obtain an accurate reading. Inductive methods for measuring current are also subject to interference. Commercially available current clamps sometimes include a low-pass filter to partially mitigate the effects of interference on current measurements. Nonetheless, for continuous, long-term monitoring of current flow, current non-invasive methods provide an expensive solution.

Increasing concerns about energy use, its environmental effects, and the cost of energy—especially in regions that implement increased pricing for peak-demand periods—have resulted in the development of systems for monitoring home and business energy use and controlling appliances to limit energy consumption. Nonetheless, there remains a need for an efficient, easy, and inexpensive way to measure current flowing through a circuit breaker.

In light of the above, it would be useful to provide a device for placement on a circuit breaker which would then measure the current flowing through the circuit breaker without direct contact with the current.

It would be further advantageous to provide an economical system for measuring current magnitudes in a circuit breaker panel.

It would be further advantageous to provide an economical system for monitoring current magnitudes in a circuit breaker panel which provides simplified automatic calibration of errors in the positioning of the sensor relative to the breaker, and easy automatic calibration of other error sources such as adjacent circuits.

It would be further advantageous to provide a system for measuring currents in a circuit breaker panel in which one or more measuring devices could simply be placed over and adjacent to the breaker.

SUMMARY OF THE INVENTION

The present invention provides a system for measuring current magnitudes in a circuit breaker panel. Low cost, integrated vector (3-sensor) magnetometers typically used for electronic compasses provide sensors capable of detecting the magnetic field associated with the conductive path through a standard switchboard push-in circuit breaker and its associated output load wire. The magnetometers are selected for a measurement rate of 120 Hz or greater to enable sufficient Nyquist bandwidth for detection of the 60 Hz waveform typical in the United States, They are also selected for sufficient resolution (no greater than about 1 amp RMS) to monitor the net current through a branch circuit.

A preferred embodiment uses two or three sensors for a branch-type single phase circuit breaker, where one sensor is directly over the chosen breaker and the other one or two adjacent to it (either above, below, or both), For a main breaker, three sensors are incorporated into a group where they are positioned with one directly over the incoming main conductor for each phase, and the remainder to each side in a single phase system, or between the two phases in a two-phase system. For a three-phase system, four or five sensors would be required, using the same type of positioning. The sensors are provided with an adhesive or magnetic stick-on for easy attachment to the circuit breakers. In general, adhesive attachments are preferred to magnetic attachment, as the latter could force the sensor into a lower gain mode and thus limit sensitivity.

The information collected by the sensors is sent to a processing element that will perform the necessary data acquisition and signal processing functions to reduce the magnetic field measurements to an estimate of the current carried by the conductor. The information thus collected and processed will be analyzed further to eliminate or reduce the effects of external interference sources such as the geomagnetic field, and to eliminate or reduce the effects of local interference sources such as currents in adjacent circuit breakers.

The resulting data will be communicated back to a user system in the form of an estimated current measurement (either instantaneous, or with some amount of noise rejection or moving average). The user system can then use this information to better manage its amount of current input and output.

BRIEF DESCRIPTION OF THE DRAWING

The nature, object, and advantages of the present invention will become more apparent to those skilled in the art after considering the following detailed description in connection with the accompanying drawings, in which like reference numerals designate like parts throughout, and wherein.

DETAILED DESCRIPTION

The present invention is directed to a system for measuring current carried through a wire, and, in preferred embodiments, employed for the detection of current magnitudes in a circuit breaker panel.

Figure 1:
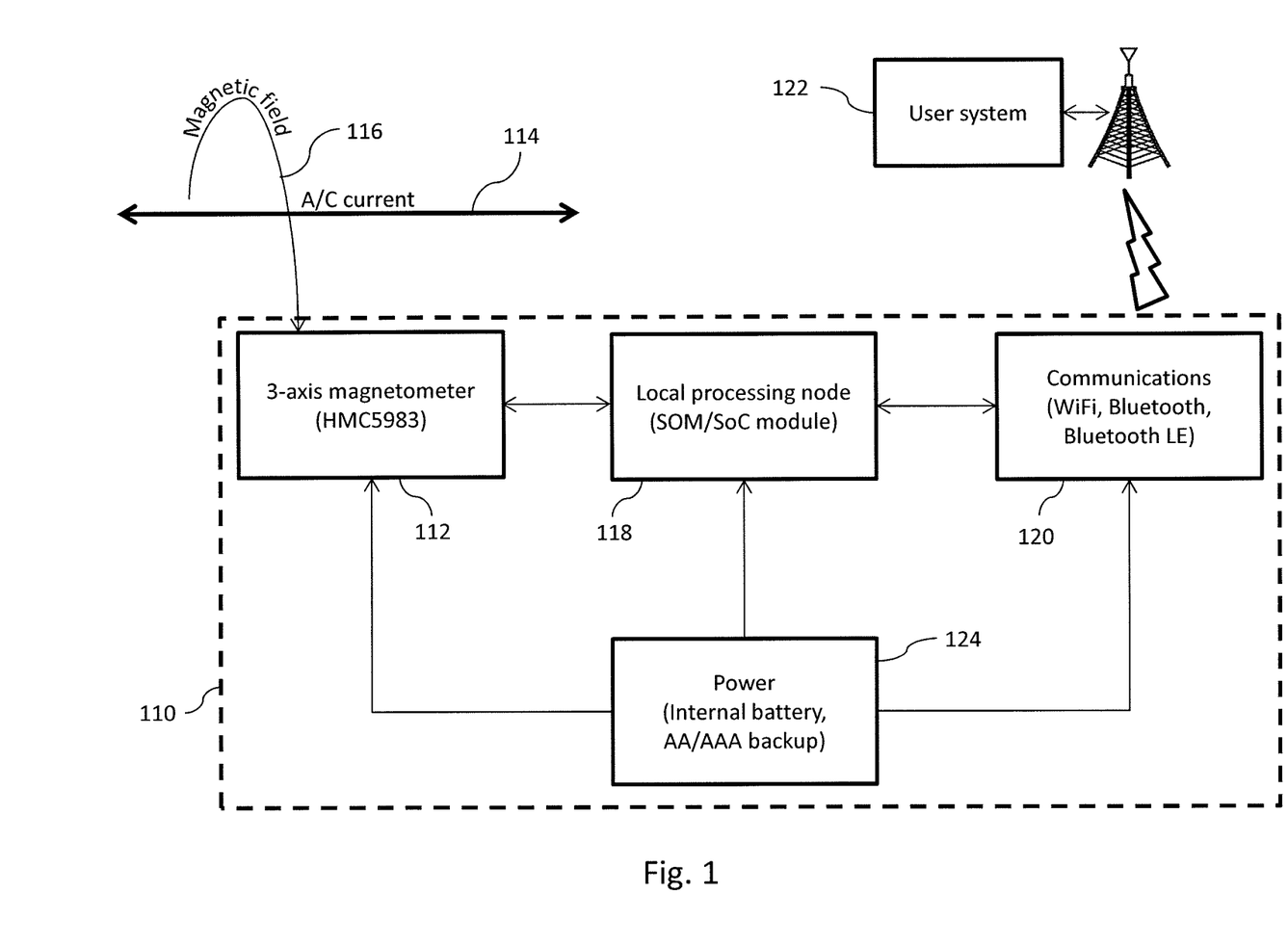
FIG. 1 is a diagram of the system for current magnitude detection of the present invention.

Referring initially to FIG. 1, an overview of the system for vector magnetometer based detection of current magnitudes is shown. Integral to the system is a current measurement device 110. The device 110 includes one or more sensors 112 which comprise 3-axis magnetometers, and is installed such that the sensors 112 are located near the paths of current 114 to be measured. In a common implementation, current paths 114 are through the main breaker and branch circuits in a circuit breaker enclosure, and the device 110 is installed such that the sensors 112 are placed over the breakers. The number and positioning of the sensors is discussed more fully below.

In an embodiment, the sensors 112 are based on HMC5983 3-axis integrated circuit magnetometers. Other sensors may be used, however, provided they have the sensing rate and resolution required. More generally, the sensors 112 are chosen from sensors able to switch back and forth between a high rate measurement of one-hundred twenty (120) Hz and above, preferably one-hundred fifty (150) Hz and above, and a low rate of thirty (30) Hz or less, with minimum power standby to minimize average power consumption. A one-hundred twenty (120) Hz or greater measurement rate enables sufficient Nyquist bandwidth for the detection of the sixty (60) Hz AC waveform commonly found in U.S. residences. Lesser rates may be sufficient in certain foreign applications, and greater rates may be necessary or desirable in certain situations. Nonetheless, in normal household and industrial applications, a measurement rate of below four-hundred (400) to six hundred (600) Hz is used in preferred embodiments in order to minimize power consumption. Sensors meeting these requirements are generally available for less than $5 BOM.

The current flowing through current path 114 creates a magnetic field 116 which is detected by the sensors 112. The information from the sensors 112 is sent to a local processing node 118. In preferred embodiments the local processing node 118 comprises a System on a Module (SOM) or System on a Chip (SoC), such as Nordic Semiconductor nRF51822 BLE modules that incorporate a small ARM processor, a full BLE stack, and a wide variety of digital and analog I/O. The local processing node 118 needs to be capable of on-board signal processing including input scaling, simple math to remove known biases and compare signals between different sensor locations, bandpass filtering to extract the power line frequency element of the signal, and vector math to further refine the signals. With up to 10 sensors 112, each outputting six to eight bytes of data at between two hundred (200) and four-hundred (400) Hz, the total data rate of about twelve to about thirty-two kB/s would likely result in a processing requirement of less than ten to twenty MIPS for all of the required processing to maintain a real time operation. In testing, I/O processing was performed on an Arduino Uno (about one to four MIPS), and required about one thousand eight-hundred fifty (1850) microseconds, of which about one-thousand four-hundred fifty (1450) was to communicate the output data at 115,200 bps to a laptop, so ten sensors 112 worth of I/O processing on a minimum ten MIPS device is likely to only require about one-tenth of the overall cycle time. Overall data bandwidth from ten sensors 112 of about twenty to forty kbps is well within the capability of a single I2C or SPI bus connection.

Sensors 112 used in preferred embodiments of the present invention provide either I2C (two wire) or SPI (4 wire) communications to the local processing node 118. While the I2C is the simplest and requires the least traces to the sensors, sensors using fixed I2C addresses would require an I2C multiplexer or a number of local node I2C ports equal to the number of sensors. While the multiplexer is not expensive or difficult (less than $5 BOM), it does then mean that individual sensors would each have a separate two-wire connection. If using SPI, then all the attached sensors can share three of the four lines, with each having a separate CS (chip select) line to be driven by the local node. Either option works well with the present invention.

After detection by the sensors 112 and processing by the local processing node 118, the resulting data is provided in the form of an estimated current (either instantaneous, or with some amount of noise rejection or moving average). A communications element 120 sends the resulting data as an estimated current to a user system 122 such as the Orison™ Panel which can then use this information to better manage its amount of current input and output. User system 122 may include an intelligent energy management system, a website having tools for reporting data from and managing the current measurement device 110, a local computer with one or more programs which report data from and allow management of the current measurement device 110, a smartphone application for reporting data from and managing the current measurement device 110, any related system known in the art, or any combination of the above. An end user device forming part of the user system 122 may communicate directly through the communications element 120, or indirectly via an intermediary such as a local or internet-connected server which handles communications with the current measurement device 110 through the communications element 120. In preferred embodiments, communications are performed wirelessly, such as through Bluetooth, Bluetooth LE, or WiFi.

A power source 124 provides the necessary energy to the current measurement device 110. Estimated power consumption for the sensors 112, using the HMC5983 magnetometers, is five to ten mW at maximum measurement rate, and less than ten microwatts in standby. With an approximate 2% duty cycle (2×60 Hz cycles of measurement every three seconds), this equates to an average power consumption of two-tenths of a milliwatt (i.e. 1500 hours for 10 sensors on a single 2500 mAh AA alkaline battery). A local processing node 118 and communications framework 120 using nRF51822 BLE modules is expected to consume less than thirty mW during full power transmit, and less than ten microwatts during standby. Using the 20% duty cycle, this equates to an average power consumption of 0.6 mW for a total ten-sensor with local node consumption of less than 2.6 mW, or about six months of operation on four 2500 mAh AA alkaline batteries, or about twenty-three Wh per year if a rechargeable battery is used. In a preferred embodiment, power source 124 comprises an internal rechargeable battery with AA or AAA battery backup, wherein the user is notified electronically to charge the system when required.

Figure 2A:
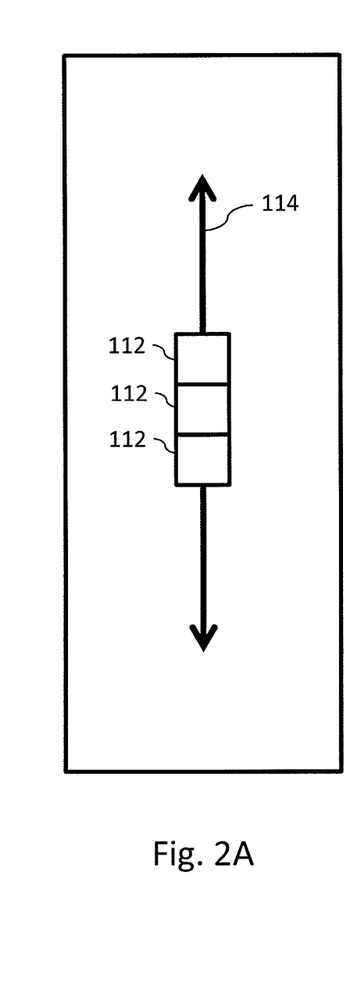
FIG. 2A is a diagram of a placement of sensors on a branch-type single-phase circuit breaker.

Before operation, the device 110 needs to be installed and calibrated. The number and placement of the sensors may vary according to cable and breaker box geometry, but in general two or three sensors are preferred for a branch-type single phase circuit breaker, three sensors for a single-phase or two-phase main breaker, and four to five sensors for a three-phase main breaker. The sensors are attached with a built-in attachment mechanism, which can either be adhesive or magnetic. Preferred placement on various types of circuit breakers is depicted in FIGS. 2A through 2D. Referring now to FIG. 2A, a representation of a branch-type single-phase circuit breaker is shown. Three sensors 112 are used, with a first directly over the breaker, a second above and adjacent to the first, and a third below and adjacent the first. Depending on the particular situation, it may be more practical to use only two sensors 112. In such a case, the first would be placed directly over the breaker, and the second adjacent to it and either above or below as desired.

Figure 2B:
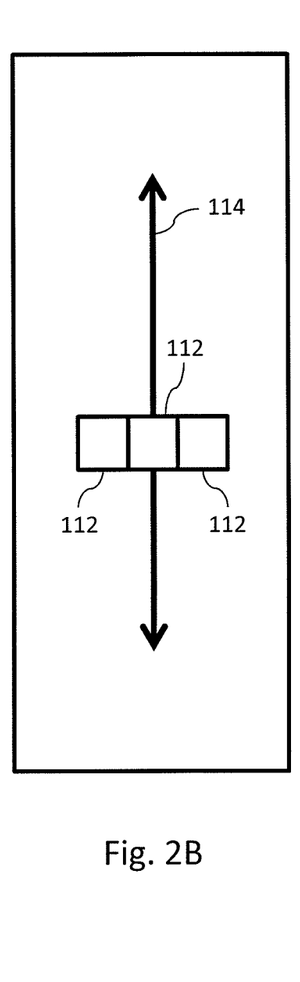
FIG. 2B is a diagram of a preferred placement of sensors on a branch-type single-phase circuit breaker or a single-phase main breaker.

Referring now to FIG. 2B, a representation of a branch-type single-phase circuit breaker is shown. Three sensors 112 are used, with a first directly over the breaker, and the second and third adjacent to it, on the left and right, respectively. Three sensors 112 would also be sufficient to measure two adjacent breakers. In such a case, one sensor would be placed over each, and a third sensor would be placed off to one side. An optional fourth sensor could be placed off to the other side.

The layout shown in FIG. 2B would also work for a single phase main breaker.

Figure 2C:
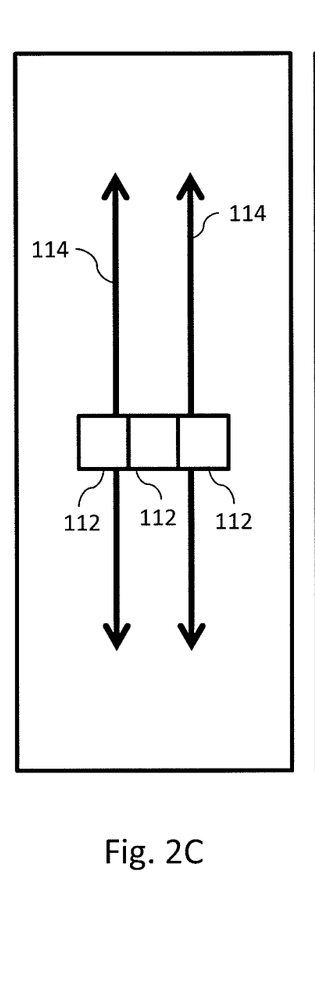
FIG. 2C is a diagram of a preferred placement of sensors on a two-phase main breaker.

Referring now to FIG. 2C, a representation of a two-phase main breaker is shown. Three sensors 112 are used, with one sensor 112 over each phase, and the third in between the two phases. An optional fourth sensor could be placed off to the side for greater accuracy. The use of a fifth sensor on the opposite side of the fourth sensor is also contemplated.

Figure 2D:
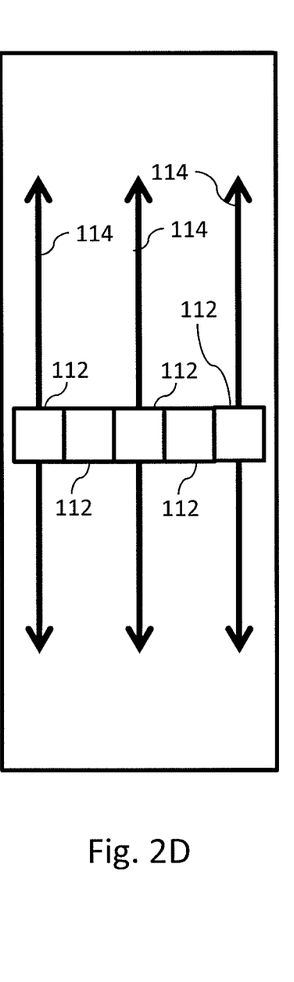
FIG. 2D is a diagram of a preferred placement of sensors on a three-phase main breaker.

Referring now to FIG. 2D, a representation of a three-phase main breaker is shown. Four or five sensors 112 are preferred for a three-phase system. In FIG. 2D, five sensors 112 are shown, with one sensor 112 over each phase, and the remaining two sensors 112 in between the phases. Although five sensors are shown in FIG. 2D, accurate readings could still be obtained with only four sensors. In such a layout, either one of the sensors in between the phases could be eliminated.

Once the sensors are installed, the system needs to be calibrated for use. In particular, the system must determine what other magnetic fields are present, and what impact those have on the measurement of the designated breaker(s). In order to remove the local DC field during initial calibration, the sensor need only record field data over a reasonable amount of time (several seconds), and remove via signal processing any 60 Hz variation of that field. This DC field vector can then be removed from all future AC measurements.

Before monitoring of any specific variations of the designated branch breaker, the system needs to determine the vector direction of nearby AC fields. This could be done as a preliminary method by having the user open and close the nearby branch breakers on direction of a mobile app forming part of the user system 122—the system could then observe these transients (assuming there are existing loads on those circuits) to determine the vector orientation of those nearby interfering fields. If there is insufficient load, the user could be directed to add load to those circuits (i.e. plug in a hair dryer or other appliance). For the main breaker, this type of calibration is likely unnecessary as its calibration would be incorporated into other aspects of the calibration.

In general, any AC calibration method relies on the observation of known variable loading conditions. First, a baseline case is recorded, and the magnetic vector vs, time, which should, to first order, be a sinusoidally varying magnitude vector of the value+/−the magnitude in a fixed direction (but reversing magnitude in that direction at 60 Hz).

The user system 122 may be simply a computer or a display configured to provide the acquired and processed data to an end user, such as a dedicated display shipped with the system, a computer program, a website interface, a mobile app, or a combination of several interface devices. However, preferred embodiments of the present invention are designed to work with intelligent energy monitoring and storage systems, such as those sold as the Orison™ Panel. Such devices are capable of communicating with the field measurement as well as creating positive and negative net currents on the system with specific time-dependent values, allowing the system to calibrate itself very effectively by observing the changes in AC fields given these known changes. The sequences can be repeated in order to remove any other transient effects such as other variable loads.

During the initial calibration with an intelligent energy device such as the Orison™ Panel, after performing the preliminary steps described above of measuring DC fields and AC vectors, the intelligent energy device performs a sequence of step load changes and the results monitored—for example, the system could provide a load of +5, +1, 0, −1, −5 Amps, each for 1 second, and repeat that 5 second sequence 10 times. This allows the sensors to confirm the field effects as follows:

For the branch circuit, the field vector of the different loads should be in the same direction, so by comparing the magnitude/direction of the measured result (which includes the nearby fields of other loads) to that of the branch circuit with these known deltas, the relationship between field and branch circuit load can be determined. Note that by having 2 or more sensors (one of which is directly over the designated breaker), load transients on other breakers can be removed (since, for example, even though the field direction due to an adjacent vector is different than the field direction of the chosen breaker, and thus two adjacent breakers with different loads could have a vector sum that has a direction identical to the designated breaker's field, having 1-2 additional sensors adjacent to the designated breaker enables these vectors to be removed). Additionally, since known load magnitudes are applied, user variations (e.g. variations in which breakers are used and the load wiring attached to them, or variations in how the sensor is positioned, etc) can be calibrated out.

For the main breaker sensor, the load sequence enables detailed calibration as well. With a 3-sensor group on a split-phase main, with the sensors having a known position relative to each other, positional variations (since different panels have different feed conductor locations, and the user installation may vary in where the sensor group is place), the combined fields of the 2 feed conductors can be measured and any other load transients removed.

An intelligent energy system may periodically repeat this calibration sequence in order to gradually eliminate the effects of other loading conditions (i.e. loads on circuit breakers N locations away), so the system will, over time, improve in accuracy.

Where an intelligent energy system is unavailable, the user may be directed through the calibration process via written instructions, or, as mentioned above, an interactive process such as a mobile app. The user would activate or deactivate various existing loads on the circuit, allowing the device 110 to proceed through the calibration process.

In situations in which the user fails to calibrate the device 110, and no intelligent energy system is available to do so, software in the device 110 may be present which allows the device to attempt self-calibration over time. The self-calibration process comprises monitoring the various measurements over time and temporally correlating them to determine the unit vectors and relative fields to current relationships of the various sensors and circuits.

Once calibrated, the system can now monitor (at variable intervals depending on what is required) overall total load (main breaker current) and net current on the sensed branches—this can be used to determine power arbitrage needs, inform the user about load variations, predict effects of energy conservation methods, etc.

Where an intelligent energy system is used as the user system 122, it may be configured to monitor the net current on its own branch, the net current on a solar inverter supplied branch, and the net current on the main grid input. Since the sensor systems at the simplest approach described above as a minimum viable product can only detect the magnitude of the current in a given branch (though, with careful signal processing it is likely possible to determine current direction by comparing the field vector orientation vs. time compared to the main breaker sensors or other sensors measuring the opposite phase of a split phase system, since inbound/outbound currents would have opposite phases and field directions), it is possible to use the intelligent energy system ability to vary its output/input to ensure net-zero output to the grid. By varying the output by a small, known amount, the net current on the main breaker can be compared to the Orison mean and dither values to converge on a proper output for net-zero to the grid (i.e. if the intelligent energy system output is increased by 1 A, and the net current on the main decreases by 1 A, leaving 2 A, then the overall output value needs to be increased by ~3 A (but likely some value less than this will be chosen to avoid net output to grid), and so on at decreasing variations until the system converges).

By comparing the net currents on the intelligent energy system branch with a branch that has a solar inverter input, and potentially using the dither methods above if required, the intelligent energy system could tailor its charge/discharge cycles to absorb a chosen amount of power from a solar supply, which would enable energy arbitrage absorption (charging of the intelligent energy system) at any variable value from zero to the instantaneous output of the solar system.

Some intelligent energy systems, such as the Orison™ system, may be designed with a mode of operation where they isolate their branch circuit from the grid in a grid-loss situation (and thereby removing their ability to sense grid voltage upstream of that breaker). This current sensing system can be used to determine when the grid returns by monitoring the current in the main breaker (which, presumably, would have some value due to loads that automatically come back on once power is restored). Once that current is observed, the system could inform the intelligent energy system that the grid is now present, and alert the user (or an automatic system) to close the islanding branch breaker and reconnect that circuit to the overall grid.

Figure 3:
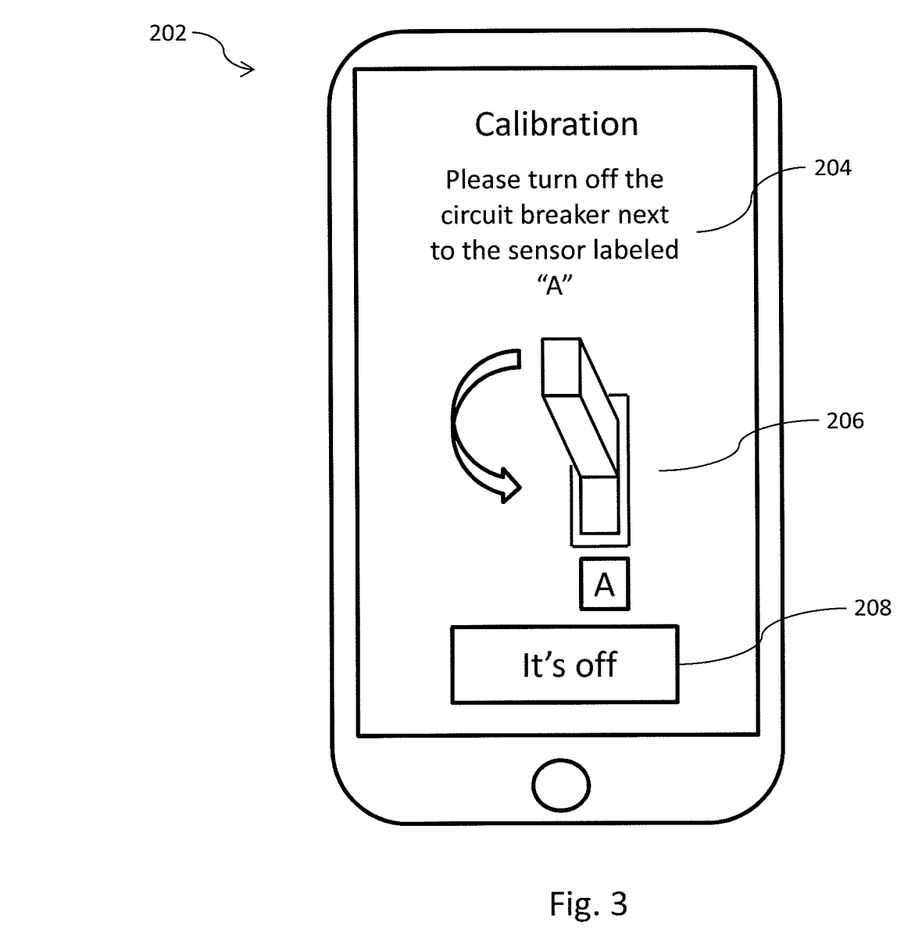
FIG. 3 is a representation of a device running an application to aid the user in calibrating the system for current magnitude detection of the present invention.

Referring now to FIG. 3, when the user system does not include an intelligent energy system that can handle the calibration process for the user, a computing device such as a mobile phone 202 may be used to guide the user through the calibration process. In such circumstances the computing device, such as the mobile phone 202, forms part of the user system 122 and communicates with the local processing node 118 via the communications element 120. The communication may be performed through an intermediary server, as described above.

A program or app running on the computing device provides instructions 204 to the user, which may include a visual representation 206 of the action the user is expected to perform. The instructions 204 and the corresponding visual representation 206, if any, will change from time to time, cycling through the steps necessary for calibration. For example, at one point, the user may be requested to turn off a circuit breaker next to a particular sensor. When the circuit breaker is turned off, the user acknowledges that the instruction has been performed through an acknowledgement button 208 or other manner appropriate to the user interface of the computing device. Once the acknowledgement has been made, the program notifies the local processing node 118, which then identifies the next measurements as representing zero current. Other steps may include turning on the circuit breaker, adding a load such as a hair dryer or other appliance, and disconnecting a previously added load. At each step, the user acknowledges the step has been performed, and the current measurement device takes measurements.

Alternatively, the local processing node 118 can be programmed to auto-detect when an instruction has been performed during a calibration sequence, obviating the need for the user to make an actual acknowledgement. For example, the local processing node 118 can detect when the measurements taken by the sensors 112 drop and thus infer that the user turned off the circuit breaker as requested.

Figure 4:
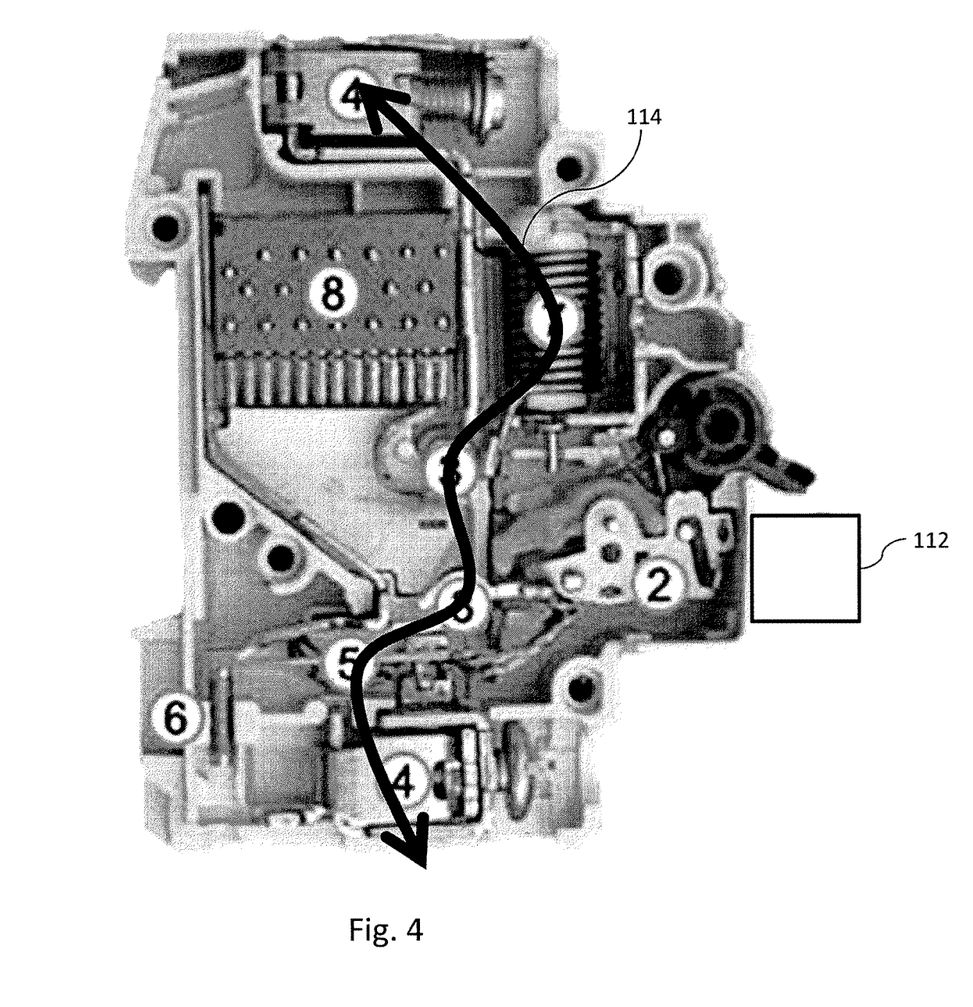
FIG. 4 is a side view of a typical circuit breaker showing the current path through the breaker and the placement of a sensor of the present invention.

Referring now to FIG. 4, the AC current path 114 through a typical circuit breaker is depicted. Given typical circuit breaker dimensions, a surface-mounted sensor 112 on the visible, exposed surface of the breaker, or immediately adjacent to it, would be on average about five (5) centimeters above both the internal current path 114 through the breaker and from the load wire. The magnetic field 116 (not shown in FIG. 2) created by the current path 114 at the location of the sensor 112 would be alternating between the outward and inward direction (that is, coming directly out of or going directly into the page), with little to no contribution in the up, down, left, and right directions.

Figure 5:
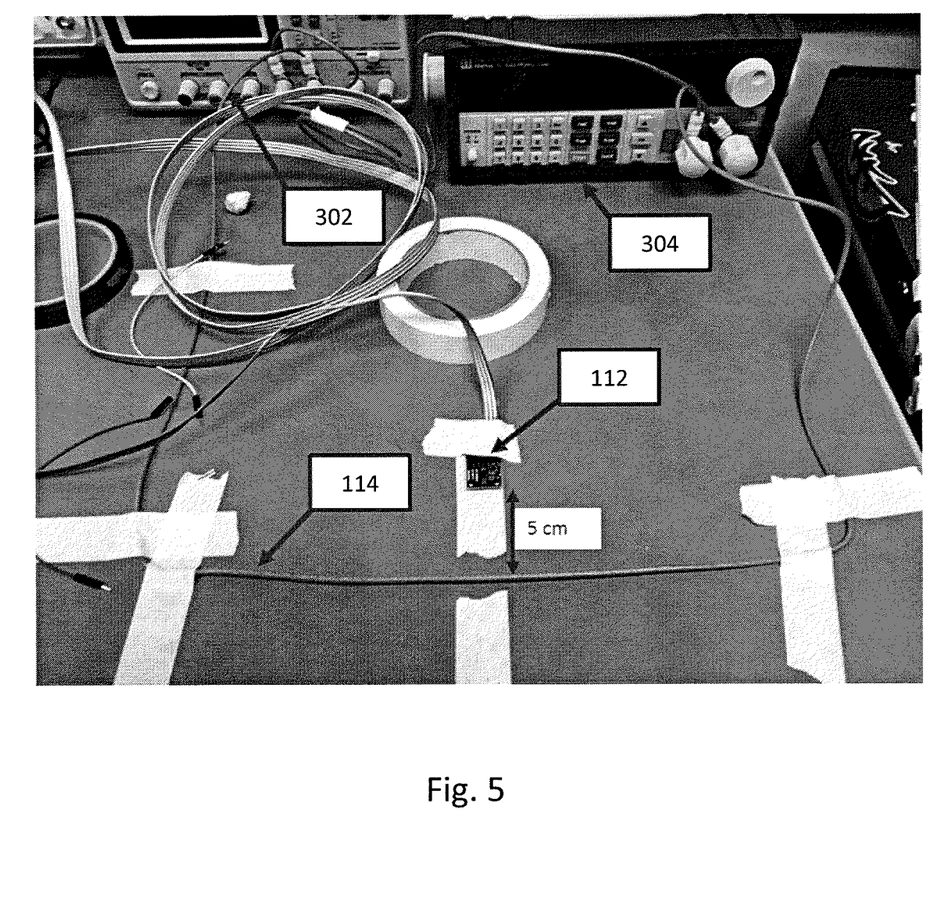
FIG. 5 is a perspective view of the sensor of the system for current magnitude detection of the present invention set up to detect current passing through a wire about five centimeters away from the sensor.

Referring now to FIG. 5, a sensor 112 is depicted about five centimeters away from a current path 114 consisting of a wire. In this setup, a DC power supply 302 and a programmable load 304 were provided to test the sensor 112 of a preferred embodiment for suitability in measuring current passing through path 114. The sensor 112 used comprises a Honeywell HMC5983 3-axis magnetometer using a two-wire I2C interface to output measurements at up to two-hundred twenty (220) Hz with an effective noise of less than five (5) mGauss.

Using this setup, first a series of rapid measurements were taken without any current present in the test wire to determine both the magnitude and direction of the geomagnetic field, as well as any steady state external fields. Based on the 0.73 mG/LSB gain of the HMC5983, the vector components of this field were +0.14, +0.21, −0.46 (x,y,z in Gauss). This measurement was then subtracted in vector from any further measurements to determine the field strength and direction change due to the presence of current in the test wire. Then current of 1 A and 2 A were passed through the wire, which should create a field in the +Z direction of ~0.04 and ~0.08 Gauss, respectively for an infinite straight wire. The values obtained in the initial testing were ~0.06 and 0.12 Gauss (with a direction unit vector Z value of >0.99). This is ~1.5× what was predicted and is due to the field contribution of the left and right legs of the test wire and the return current path green wire between the DC supply and the programmable load—as would be predicted given their relative distance from the sensor. Future testing used different wire geometry to make this difference predictable.

Figure 6:
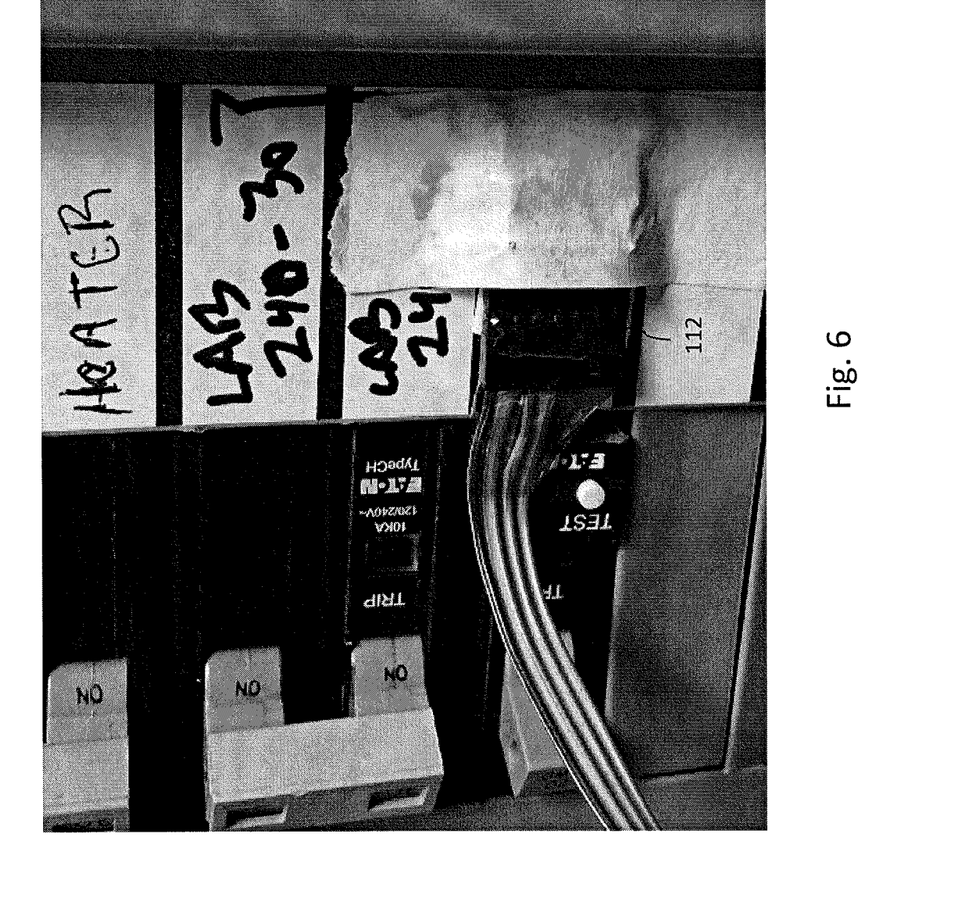
FIG. 6 is a front view of a sensor of the current invention placed on a circuit breaker.

Referring now to FIG. 6, the magnetometer sensor 112 of FIG. 3 was mounted onto an existing, operating circuit panel for additional testing. For this application, the magnitude of the magnetic field associated with the current on the branch breaker should oscillate at one-hundred twenty (120) Hz (since the magnitude is maximized twice per sixty (60) Hz cycle but the magnetic field vector due to the current will rotate one-hundred eighty (180) degrees between each peak). The system was then tested with a load of 1.7 A (rms) and 11 A (rms) by connecting two different loads (a hot plate and a heat gun, respectively) to that circuit (which had no other active loads attached), measuring their current draw using a conventional current clamp meter, and comparing the resulting magnetic field waveform magnitudes.

Figure 7:
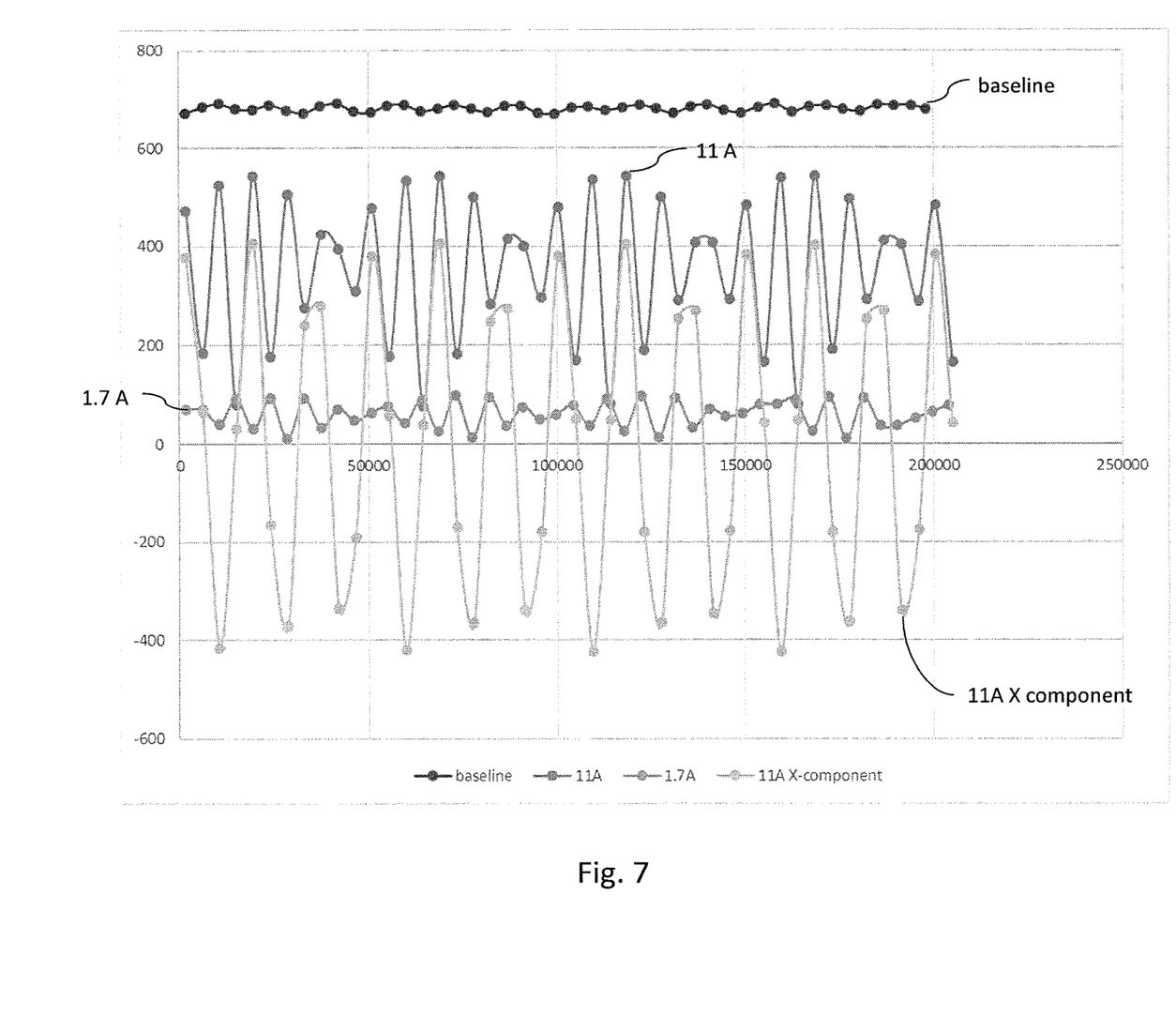
FIG. 7 is a plot of measurements taken from the sensor depicted in FIG. 4.

Referring now to FIG. 7, a plot of the measurements taken in conjunction with the testing described above is shown, in which units are in LSB vs. microseconds. The results depicted show the approach taken to be workable, and artifacts that appear can be eliminated with calibration and further signal processing. The waveform is a magnitude measurement, and thus is at one-hundred twenty (120) Hz in both cases. The overall envelope modulation of about ten (10) Hz is likely due to the interaction of the about two-hundred twenty (220) Hz sampling rate (i.e. 110 Hz Nyquist bandwidth) and the about one-hundred twenty (120) Hz magnitude modulation, resulting in a beat frequency of about ten (10) Hz when plotted in this fashion, as shown in the 11 A X-component line in the plot, the result is a sixty (60) Hz tone with little modulation. Second, the since this is only a single sensor, it is also detecting the fields due to current in the adjacent breakers and load wires—since this is a two-hundred forty (240) V split-phase system the adjacent currents are out of phase with the current through the breaker directly under the sensor. Thus, the field measured is the vector sum of the currents in these adjacent breakers as well as the current in the main bus bars that are perpendicular to the breaker and load wire axis. In preferred embodiments, multiple sensors are used as described above to enable elimination of these effects. Overall, the result is confirmatory as there appears on simple inspection that the waveforms are proportional to the current magnitudes, and the slope of peak-to-peak amplitude vs. current (~30 mG/A) is quite close to the initial rough prediction of ~40 mG/A, a difference easily explained by a difference between the actual conductor-to-sensor distance and the 5 cm prediction, effects of the perpendicular main bus bars, and the non-infinite-straight-wire nature of the actual current path. Additionally, there is likely a source of error that can be minimized due to how the ambient/baseline value was removed from the measurements. For simplicity, the baseline values were averaged over time to create an average field vector—ideally, the result of a baseline measurement would be examined to determine a DC component (the geomagnetic vector) and the AC component (due to other current carrying AC conductors nearby, and filtered to determine the effective field unit vector and its magnitude based on a one-hundred eighty (180) degree reversal during the sixty (60) Hz current cycle) and these values used in the real signal processing method.

Figure 8:
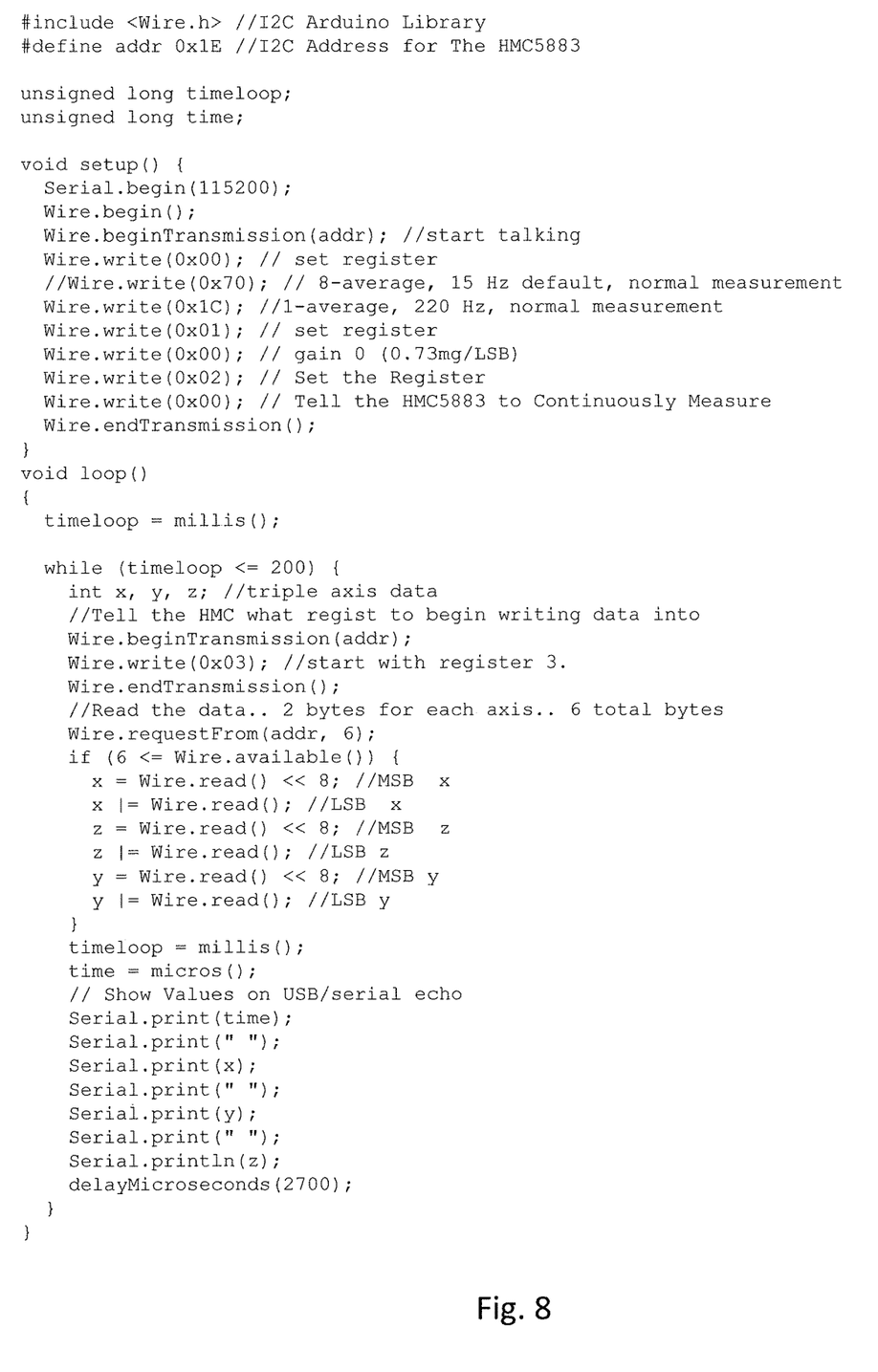
FIG. 8 is a source-code listing demonstrating HMC8953 control and communication code for an Arduino Uno microcontroller.

Referring now to FIG. 8, source code for communication and control of the HMC9853 is shown. In the experiment described above in conjunction with FIGS. 4 and 5, the communication, data acquisition, and signal processing node was based on an Arduino Uno, which performed the control, configuration, and timing of the HMC9853 and also functioned as an I2C to USB translator to communicate the HMC9853 outputs to a laptop where the data storage and signal processing was performed using Excel. FIG. 6 provides the Arduino code as used in the experiments. For the experiment, the Arduino board was reset, and the resulting data output of the serial monitor was copied into excel, first for the baseline measurement, then for each experimental measurement. The baseline component values were averaged, and then subtracted from each of the experimental data points to yield the curves shown above. Conversion from binary magnitude to field units was done using the selected gain value of 0.73 mGauss/LSB.

While there have been shown what are presently considered to be preferred embodiments of the present invention, it will be apparent to those skilled in the art that various changes, combinations, and modifications can be made herein without departing from the scope and spirit of the invention.

The invention claimed is:

1. An energy monitor for measuring current magnitudes in a circuit breaker panel so as to generate and transmit processed current information of a current carried by a defined conductive path, the energy monitor comprising:
   a circuit breaker comprising the conductive path,
   a chipset comprising a plurality of integrated vector magnetometer sensor elements for detecting a magnetic field associated with the current being carried by the conductive path through the circuit breaker, and further for generating raw magnetic field information in response thereto, each integrated vector magnetometer sensor element being individually addressable and being configured for measuring the current at a rate of 120 Hz or greater so as to enable sufficient Nyquist bandwidth detection thereby generating sensed data, the sensed data including the raw magnetic field information,
   an I2C multiplexer coupled to each of the integrated vector magnetometer sensor elements for individually addressing each sensor element and being configured for transmitting instructions to and receiving the sensed data from the vector magnetometer sensor elements, an I2C bus coupled to the I2C multiplexer and being configured for synchronizing the transmission of the sensed data, a processor in communication with the integrated vector magnetometer sensor elements via one or more of the I2C bus and the I2C multiplexer, the processor having a data acquisition and signal processing function, the processor receiving the sensed data and generating the processed current information therefrom, and a communications module, the communications module comprising one or more of a Bluetooth, a Bluetooth Low Energy, or WiFi transceiver for transmitting the processed current information, wherein the plurality of integrated vector magnetometer sensor elements comprise a first set of sensor elements, a second set of sensor element and a third set of sensor elements, wherein the first set is positioned on a first side of the conductive path, the second set is positioned on a second side of the conductive path opposite the first side, and the third set is positioned over the conductive path.

2. The energy monitor according to claim 1, wherein each sensor element is configured for cycling between a first and a second rate of measurement.

3. The energy monitor according to claim 2, wherein each sensor element is configured for cycling between a 30 Hz and a 600 Hz rate of measurement.

4. The energy monitor according to claim 3, wherein the processor is configured for performing on-board signal processing including: input scaling, bias removal, band-pass filtering, and signal refinement.

5. The energy monitor according to claim 3, wherein each integrated vector magnetometer sensor element has a dedicated connection to the processor.

6. The energy monitor according to claim 5, wherein each sensor element is configured for outputting between about six to eight bytes of data at between about two-hundred and four-hundred Hz.

7. The energy monitor according to claim 6, wherein the chipset comprises up to 10 sensor elements.

8. The energy monitor according to claim 7, wherein the overall data bandwidth is up to about 40,000 bits per second.

9. The energy monitor according to claim 1, wherein the processor is configured for generating estimate data of a current carried by the local electrical current path, and for determining a load on a current path.

10. The energy monitor according to claim 9, wherein the determined load comprises one of an overall total load or a net current of the current path.

11. The energy monitor according to claim 2, wherein the communication module is configured for communicating with a third party computing device.

12. The energy monitor according to claim 11, wherein the third party computing device comprises an intelligent energy monitoring system.

13. The energy monitor according to claim 12, wherein the third party computing device comprises a mobile phone having a client application adapted for engaging the intelligent monitoring system.

14. The energy monitor according to claim 13, wherein the mobile phone transmits instructions to the intelligent monitoring system via the client application.

* * * * *